(12) United States Patent
Funk et al.

(10) Patent No.: US 8,833,716 B2
(45) Date of Patent: Sep. 16, 2014

(54) TABLET MOUNTING SYSTEMS AND METHODS

(71) Applicant: Ergotron, Inc., St. Paul, MN (US)

(72) Inventors: Joe Funk, Rosemount, MN (US); Shaun C. Lindblad, Lino Lakes, MN (US)

(73) Assignee: Ergotron, Inc., St. Paul, MN (US)

( * ) Notice: Subject to any disclaimer, the term of this patent is extended or adjusted under 35 U.S.C. 154(b) by 0 days.

(21) Appl. No.: 13/650,631

(22) Filed: Oct. 12, 2012

(65) Prior Publication Data

US 2013/0277520 A1 Oct. 24, 2013

Related U.S. Application Data

(60) Provisional application No. 61/547,257, filed on Oct. 14, 2014, provisional application No. 61/553,620, filed on Oct. 31, 2011, provisional application No. 61/583,847, filed on Jan. 6, 2012, provisional application No. 61/590,032, filed on Jan. 24, 2012.

(51) Int. Cl.
*A47F 5/00* (2006.01)
*H05K 7/14* (2006.01)
*F16M 11/02* (2006.01)
*G01D 11/30* (2006.01)

(52) U.S. Cl.
USPC ............... 248/316.4; 248/309.1; 248/346.07; 248/924; 361/807; 379/455

(58) Field of Classification Search
USPC ......... 248/309.1, 316.1, 313, 292.12, 346.06, 248/918, 316.4, 924; 379/426, 446, 454, 379/455; 361/679.01, 807
See application file for complete search history.

(56) References Cited

U.S. PATENT DOCUMENTS

| | | | |
|---|---|---|---|
| 5,457,745 A | * | 10/1995 | Wang ............................ 379/454 |
| 5,621,890 A | | 4/1997 | Notarianni et al. |
| 6,008,621 A | | 12/1999 | Madison et al. |
| 6,189,849 B1 | | 2/2001 | Sweere et al. |
| 6,218,796 B1 | | 4/2001 | Kozlowski |
| 6,434,512 B1 | | 8/2002 | Discenzo |
| 6,796,844 B1 | | 9/2004 | Edwards, III |
| 7,055,833 B2 | | 6/2006 | Wixted et al. |
| 7,130,190 B1 | | 10/2006 | Baker |
| 7,252,277 B2 | | 8/2007 | Sweere et al. |
| 7,325,891 B1 | | 2/2008 | Kinsley et al. |

(Continued)

FOREIGN PATENT DOCUMENTS

| EP | 0997399 A2 | 5/2000 |
|---|---|---|
| EP | 2045689 A2 | 4/2009 |

(Continued)

OTHER PUBLICATIONS

PCT/US2012/059926, International Search Report and Written Opinion dated Feb. 8, 2013, 10 pages.

(Continued)

*Primary Examiner* — Tan Le
(74) *Attorney, Agent, or Firm* — Schwegman Lundberg & Woessner, P.A.

(57) ABSTRACT

A tablet mounting system for mounting a tablet. A tablet mounting system with an interface for attaching the mounted tablet to a support object. A tablet mounting system with edge retaining members to retain the tablet.

14 Claims, 10 Drawing Sheets

(56) References Cited

U.S. PATENT DOCUMENTS

| | | | |
|---|---|---|---|
| 7,537,190 B2 * | 5/2009 | Fan | 248/309.1 |
| 7,551,458 B2 * | 6/2009 | Carnevali | 361/807 |
| 7,643,291 B2 | 1/2010 | Mallia et al. | |
| 7,845,608 B1 | 12/2010 | Chen et al. | |
| 7,887,014 B2 | 2/2011 | Lindblad et al. | |
| 7,984,886 B2 * | 7/2011 | Lin | 248/181.1 |
| 8,074,951 B2 * | 12/2011 | Carnevali | 248/313 |
| 8,240,628 B2 * | 8/2012 | Huang | 248/316.1 |
| 8,243,455 B1 | 8/2012 | Raymond et al. | |
| 8,469,325 B2 * | 6/2013 | Yu | 248/316.1 |
| 2003/0111245 A1 | 6/2003 | Haggerty | |
| 2003/0222848 A1 | 12/2003 | Solomon et al. | |
| 2004/0240167 A1 | 12/2004 | Ledbetter et al. | |
| 2004/0257753 A1 | 12/2004 | Rossini | |
| 2005/0110461 A1 | 5/2005 | Mcconnell et al. | |
| 2006/0274495 A1 | 12/2006 | Nakamura et al. | |
| 2007/0002533 A1 | 1/2007 | Kogan et al. | |
| 2007/0084978 A1 | 4/2007 | Martin et al. | |
| 2007/0168593 A1 | 7/2007 | Montag et al. | |
| 2007/0259554 A1 | 11/2007 | Lindblad | |
| 2009/0146911 A1 | 6/2009 | Kang | |
| 2009/0240370 A1 | 9/2009 | Nichols et al. | |
| 2009/0270727 A1 | 10/2009 | Zhao et al. | |
| 2010/0176254 A1 | 7/2010 | Sweere et al. | |
| 2011/0193524 A1 | 8/2011 | Hazzard et al. | |
| 2011/0240830 A1 | 10/2011 | Alemozafar et al. | |
| 2011/0266930 A1 | 11/2011 | Petrick et al. | |
| 2011/0267782 A1 | 11/2011 | Petrick et al. | |
| 2011/0309591 A1 | 12/2011 | Petrick et al. | |
| 2012/0119040 A1 | 5/2012 | Ergun et al. | |
| 2012/0173033 A1 | 7/2012 | Tischer | |
| 2012/0187056 A1 | 7/2012 | Hazzard et al. | |
| 2013/0092805 A1 | 4/2013 | Funk et al. | |
| 2013/0092811 A1 | 4/2013 | Funk et al. | |
| 2013/0277930 A1 | 10/2013 | Ergun et al. | |
| 2013/0279106 A1 | 10/2013 | Ergun et al. | |
| 2013/0279109 A1 | 10/2013 | Lindblad et al. | |

FOREIGN PATENT DOCUMENTS

| | | |
|---|---|---|
| WO | WO-01/77799 A1 | 10/2001 |
| WO | WO-2011/017757 A1 | 2/2011 |
| WO | WO-2013/056025 A1 | 4/2013 |
| WO | WO-2013/056029 A1 | 4/2013 |

OTHER PUBLICATIONS

"U.S. Appl. No. 13/025,782, Non Final Office Action mailed Oct. 9, 2012", 11 pgs.

"Ergotron® Work-Fit C-Mod", Product Sheet © 2009 Ergotron, Inc., (Aug. 10, 2009), 2 pgs.

"International Application Serial No. PCT/US2011/024534, International Search Report mailed Apr. 15, 2011", 2 pgs.

"International Application Serial No. PCT/US2011/024534, Written Opinion mailed Apr. 15, 2011", 8 pgs.

"International Application Serial No. PCT/US2012/059922, International Search Report mailed Feb. 4, 2013", 3 pgs.

"International Application Serial No. PCT/US2012/059922, Written Opinion mailed Feb. 4, 2013", 5 pgs.

"International Application Serial No. PCT/US2012/060042, International Search Report mailed Jan. 30, 2013", 4 pgs.

"International Application Serial No. PCT/US2012/060042, Written Opinion mailed Jan. 30, 2013", 6 pgs.

"International Application Serial No. PCT/US2012/060049, International Search Report mailed Feb. 19, 2013", 4 pgs.

"International Application Serial No. PCT/US2012/060049, Written Opinion mailed Feb. 19, 2013", 7 pgs.

"International Application Serial No. PCT/US2012/060053, International Search Report mailed Feb. 25, 2013", 4 pgs.

"International Application Serial No. PCT/US2012/060053, Written Opinion mailed Feb. 25, 2013", 5 pgs.

"International Application Serial No. PCT/US2012/060056, International Search Report mailed Feb. 22, 2013", 3 pgs.

"International Application Serial No. PCT/US2012/060056, Written Opinion mailed Feb. 22, 2013", 5 pgs.

* cited by examiner

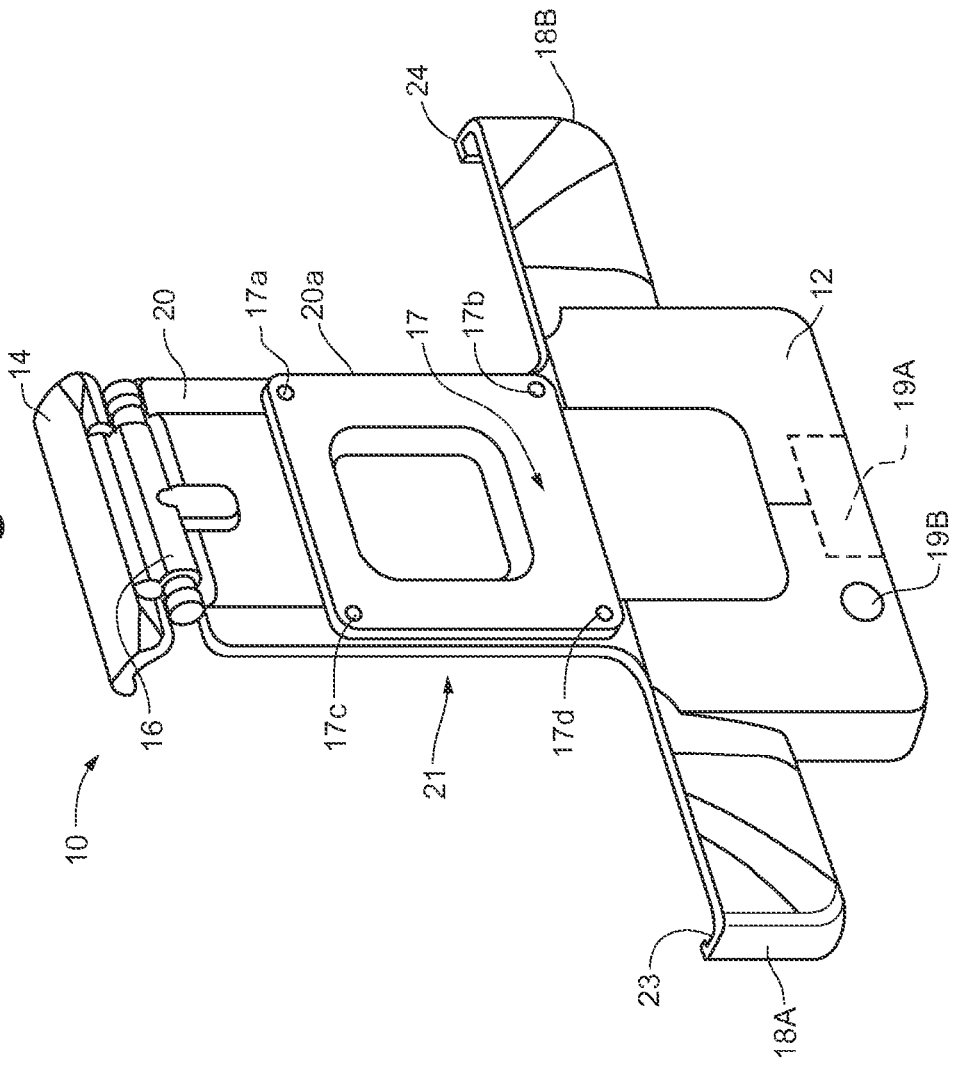

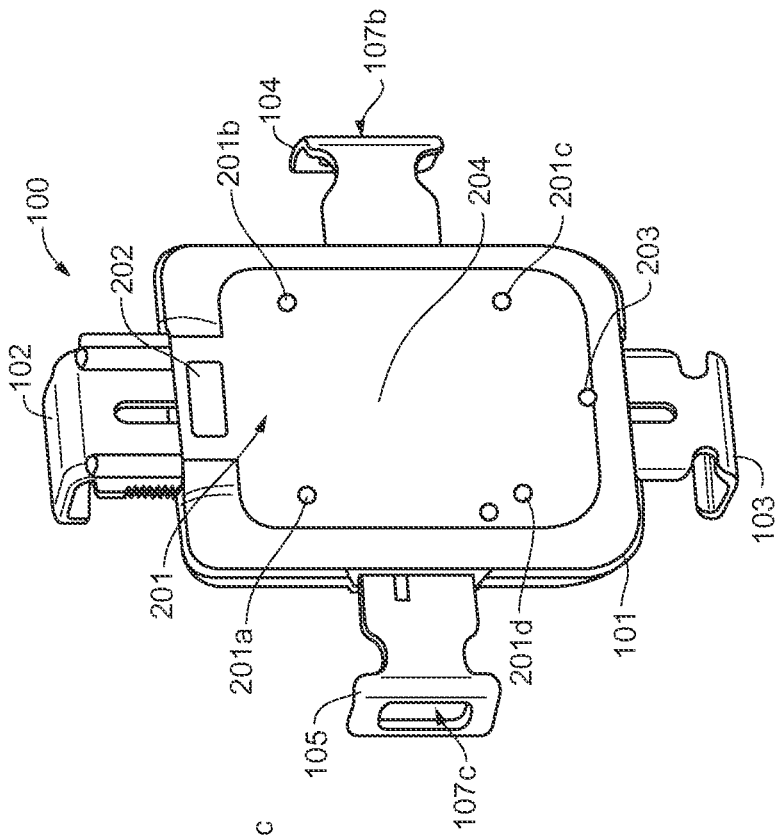
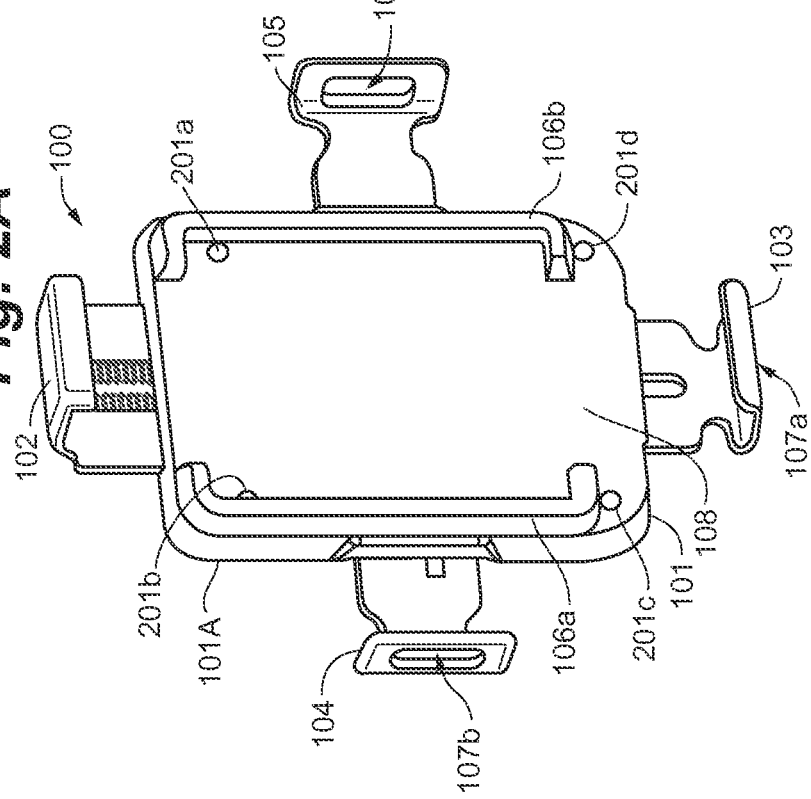

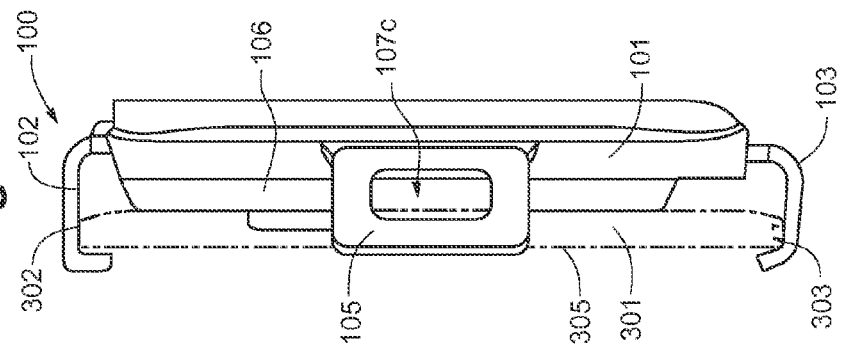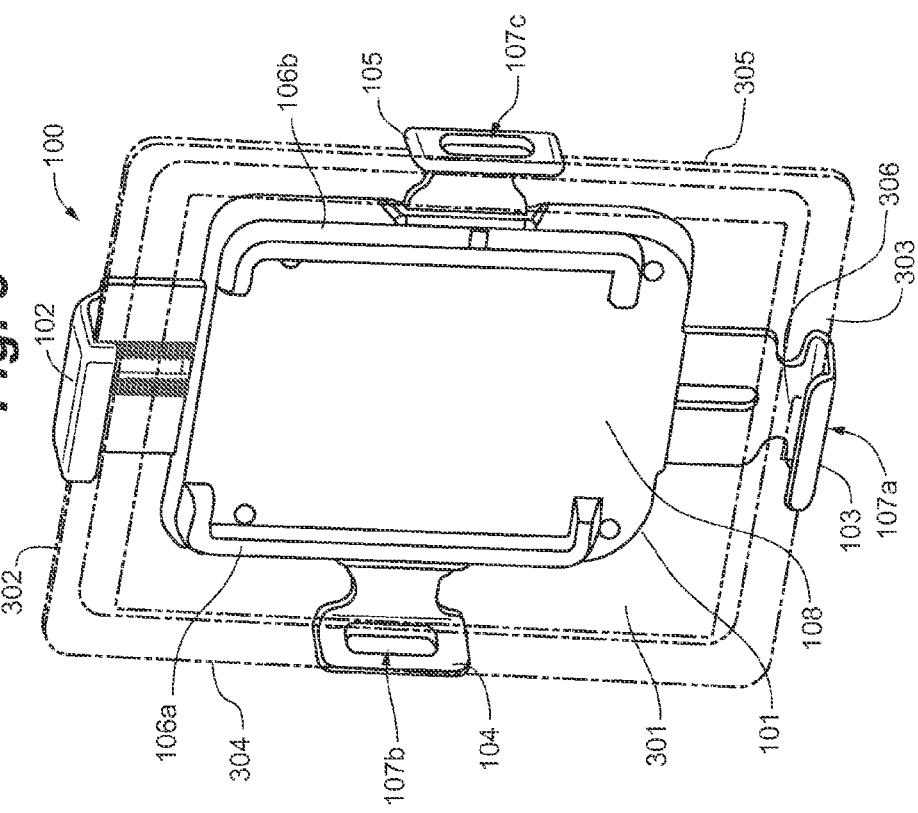

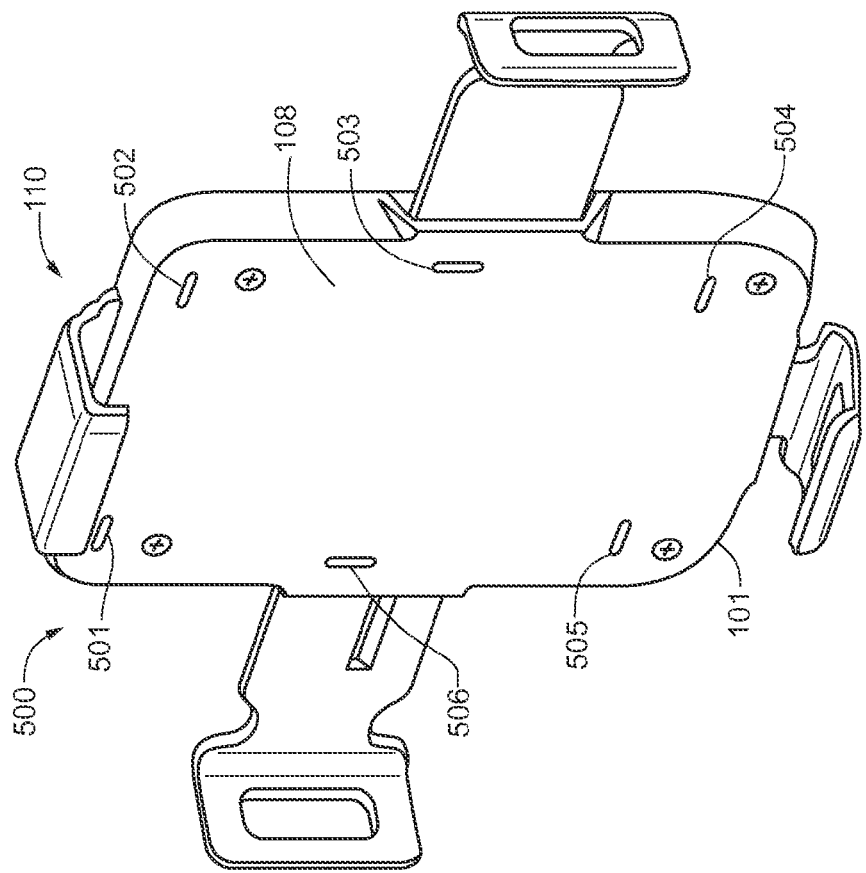
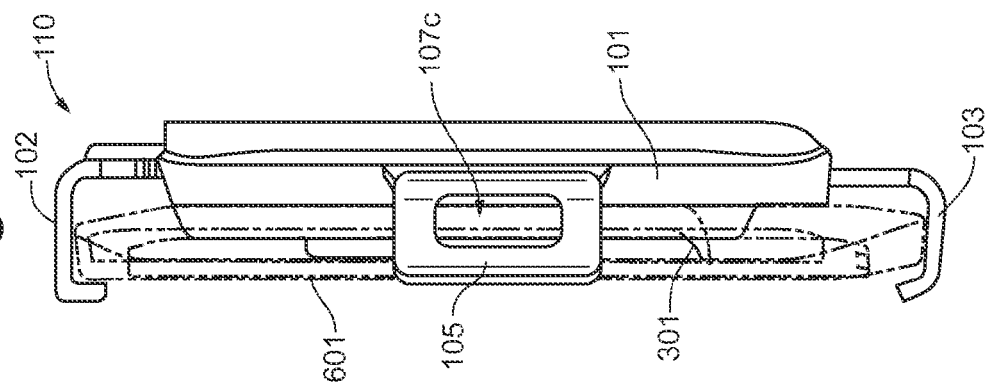

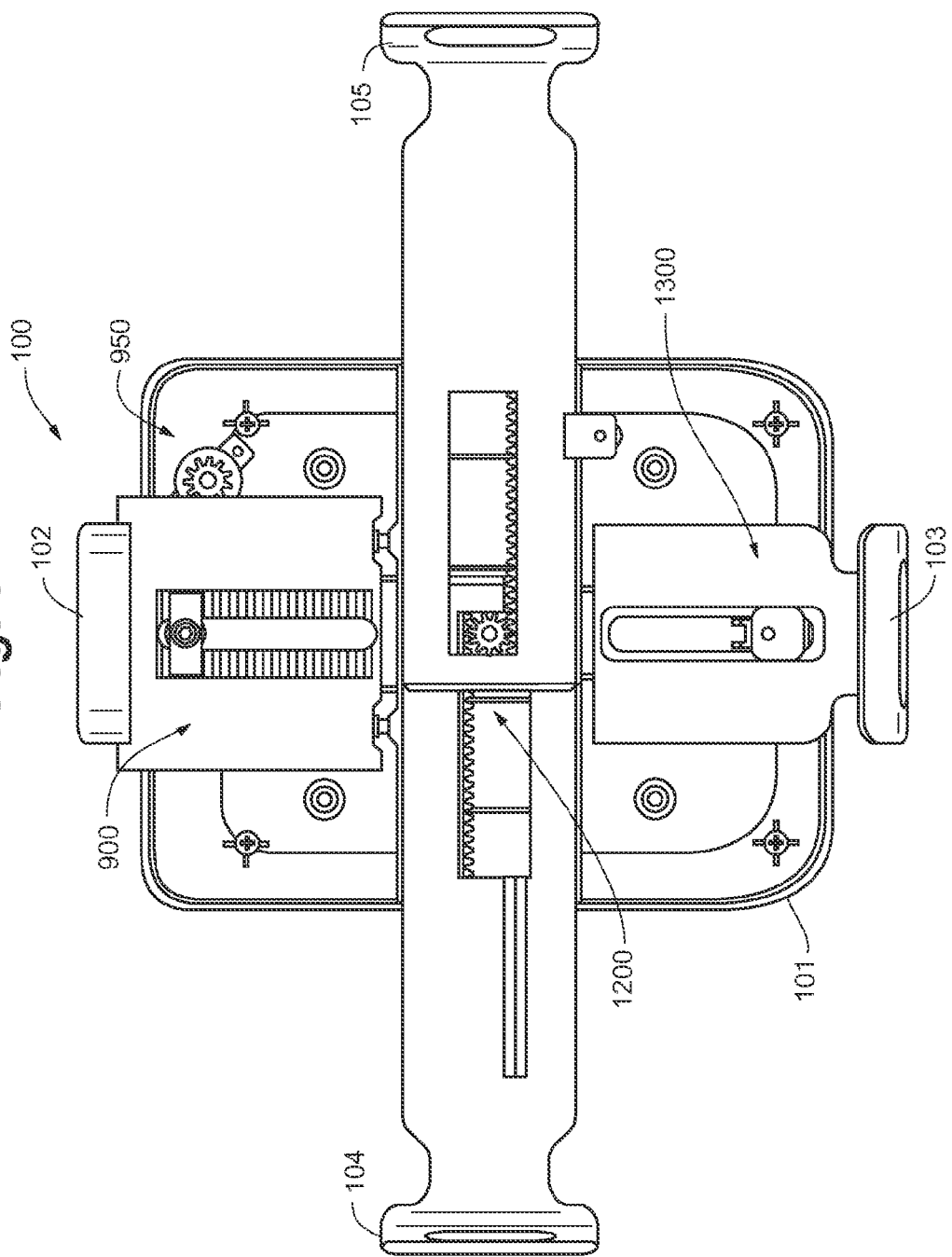

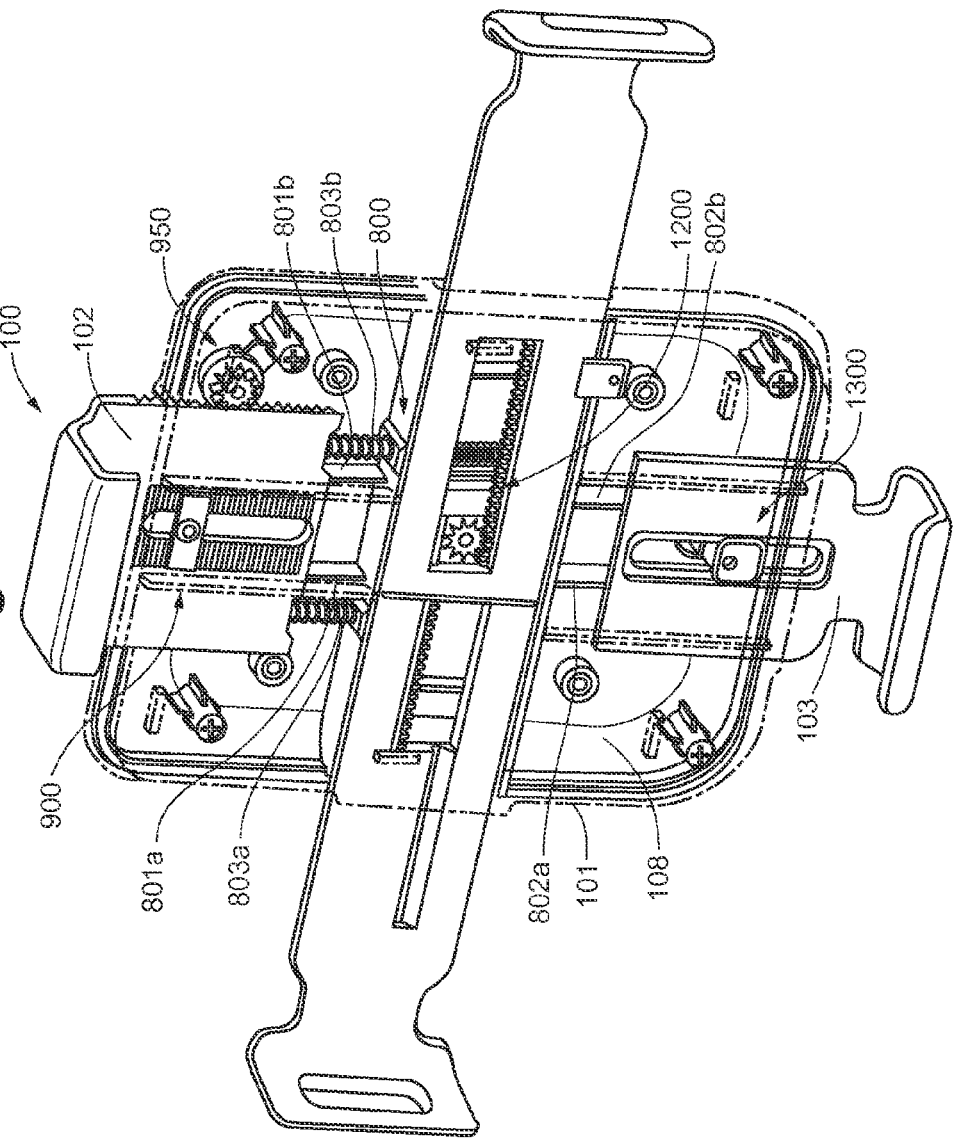

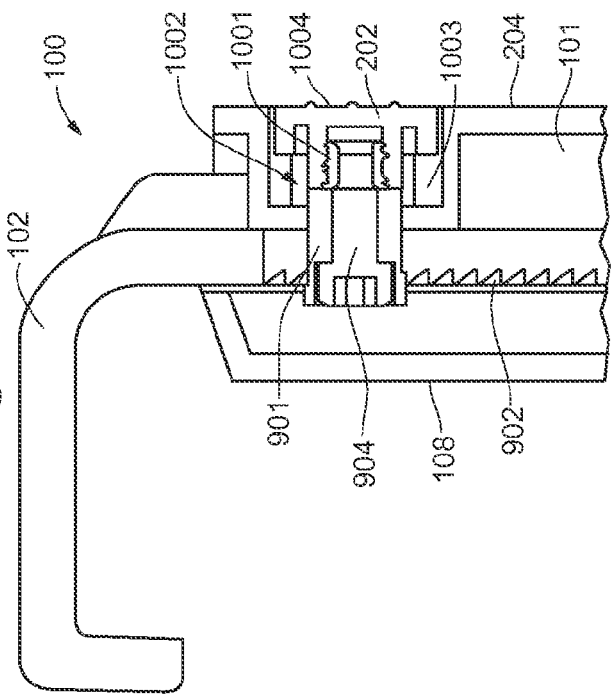
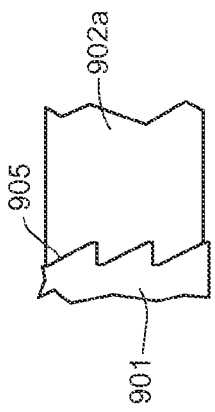
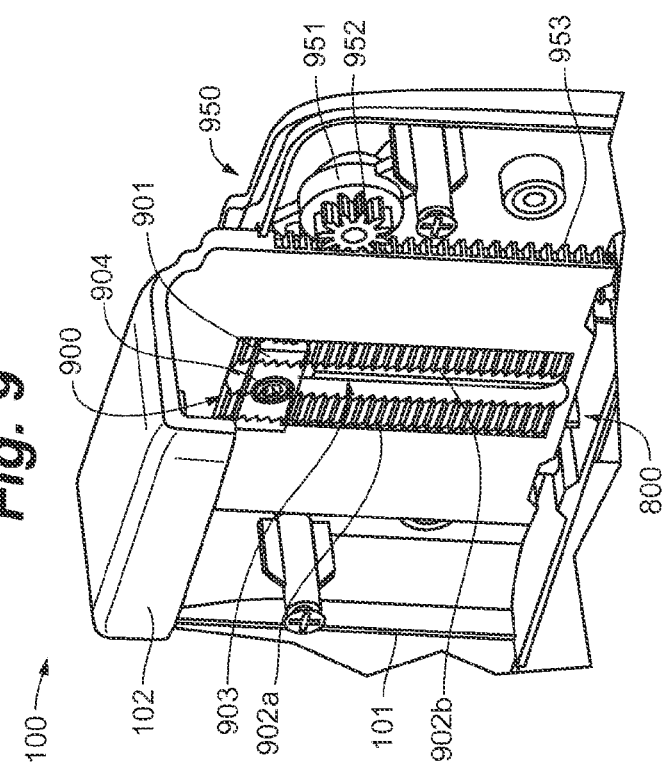

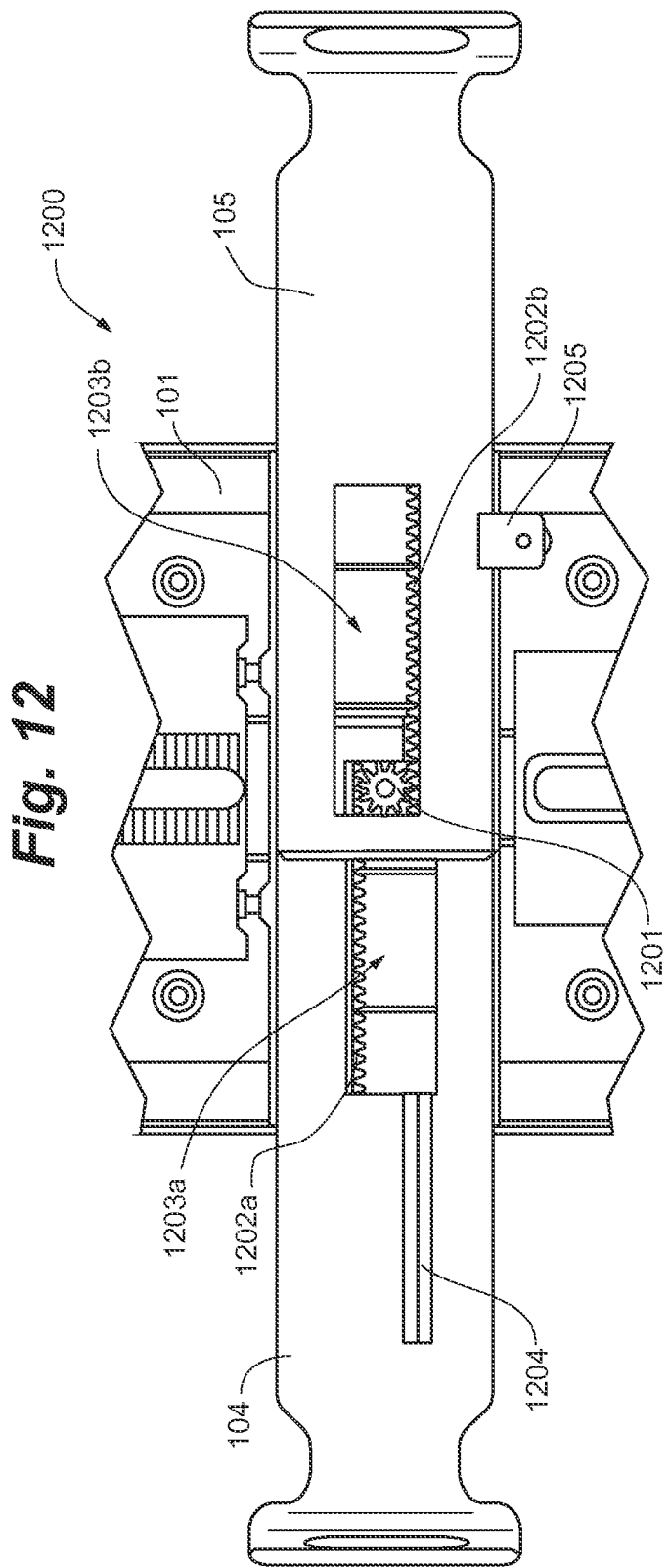

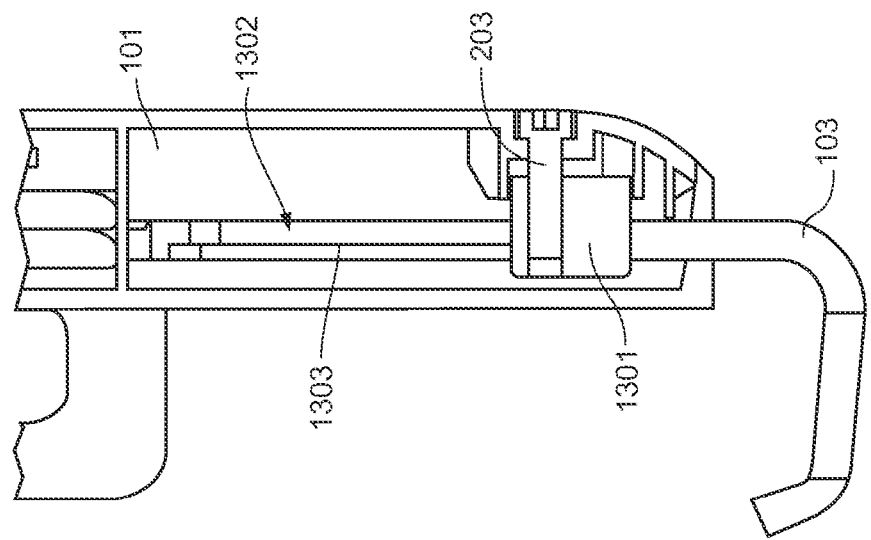
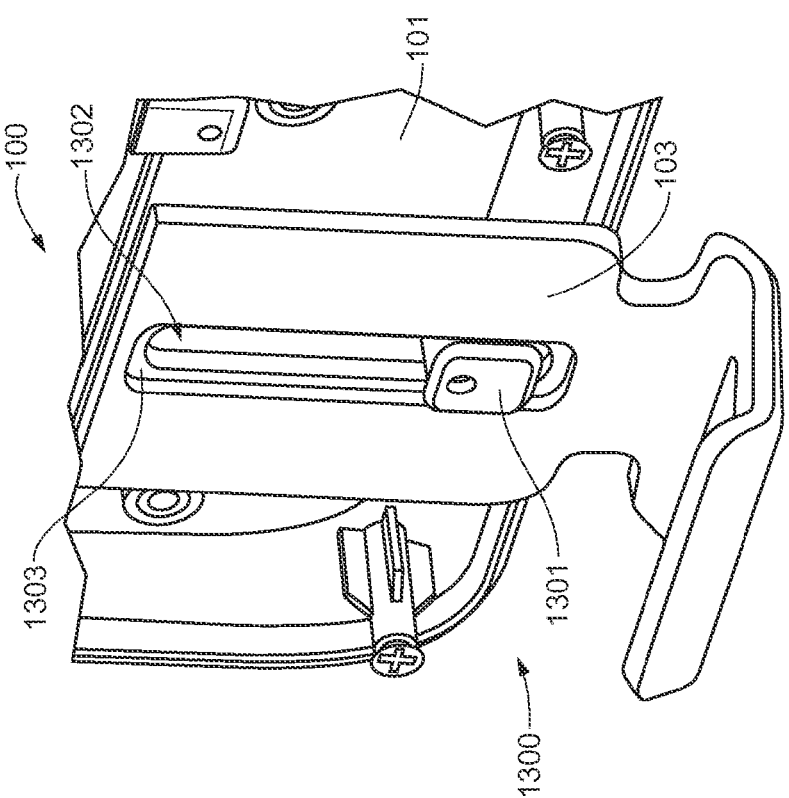

TABLET MOUNTING SYSTEMS AND METHODS

RELATED APPLICATIONS

This application claims the benefit of U.S. Provisional Application Ser. Nos. 61/547,257, 61/553,620, 61/583,847, and 61/590,032, all four of which are entitled Tablet Mounting Systems and Methods, filed Oct. 14, 2011, Oct. 31, 2011, Jan. 6, 2012 and Jan. 24, 2012, respectively, the contents of each of which are hereby incorporated by reference.

FIELD

This disclosure generally relates to systems, devices and methods for mounting a mobile computing device, such as a tablet computing device.

BACKGROUND

Tablets, sometimes referred to as tablet computers, are generally planar, lightweight devices that include a touch-screen display. Examples include the Apple iPad, Kindle Fire, Motorola Xoom, Samsung Galaxy, Blackberry Playbook, LG Optimus Pad, Dell Streak, HP TouchPad, HTC Flyer, and Viewsonic Viewpad. Generally, tablets have a rectangular form factor about 20 CM to about 30 CM in length, about 10 CM to about 20 CM in height, and about 1 CM in thickness, with a weight of between about 400 grams to about 1 KG. Tablets also generally have a LCD or TFT display panel with a screen size of between about 15 CM and about 25 CM, between 500 MB and 1 GB of RAM, front and/or rear camera(s), about 16 GB to about 64 GB of storage, at least one HDMI and/or USB input/output, audio and charging inputs/outputs, and 3G/4G and WiFi network connections.

Tablets have many features that make them portable by nature. For example, tablets are battery powered and need only to be plugged in periodically to recharge the battery; the touch-screen display of tablets allows tablets to be operated without the use of a computer peripheral device like a mouse or keyboard; and, as noted above, the 3G/4G and WiFi network connections provide the tablet mobile internet connectivity. These features of tablets, in addition to their small form factor, allow for a high degree of portability. Consequently, a single tablet is often used in many different environments.

In most environments a user will operate a tablet while simply holding it in her hands. Some environments, however, may provide other opportunities to position a tablet. For example, a person using a tablet at a desk may place the tablet flat on the desk, prop the tablet up with books, or lean the tablet up against a wall. In addition, some tablet cases or covers are able to fold into a configuration that supports the tablet in a free-standing position.

SUMMARY

In some embodiments, a tablet mounting system allows a user to releasably retain a tablet and position it relative to a support surface. The mounting system has a support body configured to receive and support the tablet and at least two edge retaining members extending from the support body configured to retain opposing edges of the tablet. The user can move these edge retaining members relative to the support body to either retain the tablet, or release the tablet. The support body also has an interface adapted to attach the support body to an apparatus that is able to position the support body, and the retained tablet, relative to a support surface.

In certain embodiments, a tablet mounting system allows a user to releasably retain a tablet. The mounting system has a support body configured to receive and support the tablet and at least two engagement arms configured to engage opposing edges of the tablet. At least one of the engagement arms is movable relative to the support body and the engagement arms form a clamping mechanism configured to releasably retain the tablet on the support body. The tablet mounting system can also be configured to connect to a support apparatus.

A tablet mounting system allows a user to releasably retain a tablet and position it relative to a support surface in some embodiments. The mounting system has a support body configured to receive and support the tablet and four engagement arms that form a clamping mechanism configured to releasably retain the tablet. Two of the engagement arms are positioned in a first directional line in relation to the support body and are configured to retain opposing edges of the tablet. The other two engagement arms are positioned in a second directional line that is substantial perpendicular to the first line and are configured to retain a different set of opposing edges of the tablet. At least one of the four engagement arms is movable relative to the support body forming a clamping mechanism that will releasably retain the tablet. The tablet mounting system also has an interface adapted to attach the support body to an apparatus that is able to position the support body, and the retained tablet, relative to a support surface.

BRIEF DESCRIPTION OF THE DRAWINGS

The following drawings illustrate some particular embodiments of the present invention and therefore do not limit the scope of the invention. The drawings are not to scale (unless so stated) and are intended for use in conjunction with the explanations in the following detailed description. Some embodiments will hereinafter be described in conjunction with the appended drawings, wherein like numerals denote like elements.

FIG. 1 is a perspective view of a tablet mounting system in accordance with an embodiment.

FIG. 2A is a front perspective view of the tablet mounting system in accordance with an embodiment.

FIG. 2B is a rear perspective view of the tablet mounting system of FIG. 2A.

FIG. 3 is a perspective view of a tablet mounting system retaining a tablet in accordance with an embodiment.

FIG. 4 is side view of the tablet mounting system and tablet of FIG. 3.

FIG. 5 is a perspective view of a tablet mounting system in accordance with an embodiment.

FIG. 6 is a side view of the tablet mounting system of FIG. 5 retaining a tablet covered with a protective sleeve in accordance with an embodiment.

FIG. 7 is a front view of a tablet mounting system with a front cover removed in accordance with an embodiment.

FIG. 8 is a perspective view of a tablet mounting system in which a front cover has been made translucent to depict the inside of a support body in accordance with an embodiment.

FIG. 9 is a partial perspective view of a tablet mounting system illustrating an engagement arm in accordance with an embodiment.

FIG. 10 is a partial sectional side view of the tablet mounting system of FIG. 9.

FIG. 11 is a side view of a locking bracket of the tablet mounting system of FIG. 9.

FIG. 12 is a partial front view of a tablet mounting system illustrating two engagement arms in accordance with an embodiment.

FIG. 13 is a partial perspective view of a tablet mounting system illustrating an engagement arm in accordance with an embodiment.

FIG. 14 is a partial sectional side view of the tablet mounting system of FIG. 13.

DETAILED DESCRIPTION OF THE PREFERRED EMBODIMENTS

Figure 15:
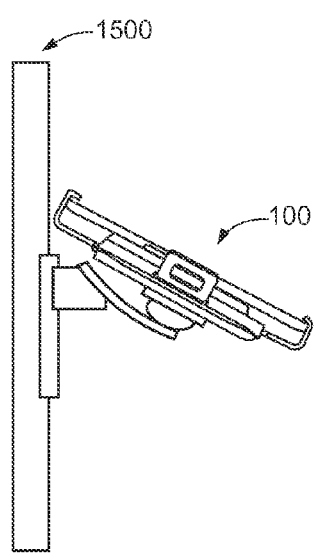
FIG. 15 is a side view of a tablet mounting system in accordance with an embodiment.

The following detailed description is exemplary in nature and is not intended to limit the scope, applicability, or configuration of the invention in any way. Rather, the following description provides some practical illustrations for implementing some embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

FIG. 1 shows an embodiment of a tablet mounting system 10 with a docking station 12 for a tablet. In the embodiment of FIG. 11, the system includes a pivotable top member 14 to pivot against a tablet when a tablet is positioned within the docking station to secure it within the docking station. The embodiment of FIG. 1 also includes an interface 17 that allows the system to be attached to a wide variety of arms, stands, wall mounts, and displays. In some embodiments, arms 18A/B and/or the top and/or bottom of the docking station are adjustable in length to accommodate a wide variety of tablet sizes. In the embodiment shown, system 10 includes edge retaining members (sometimes referred to herein as arms or retaining arms) 18A and B configured to releasably retain an edge of a tablet. In such embodiments, the arms can be translated towards or away from interface 17, and can optionally include a synchronous gear system as described herein.

In some embodiments, docking station 12 is proximate the lower portion of the system 10, and can include one or more connectors 19A to connect to a tablet received within the docketing station. Docking station 12 can also include one or more ports 19B to receive inputs from other sources and establish electrical communication with a tablet engaged with connector 19A. It should be noted that any of the tablet mounting systems described herein can be provided with docking features that connect to one or more ports in a tablet and include one or more ports for receiving inputs and electrically connecting the received inputs to the table.

Tablet mounting system 10 can also include a support body 20 with a front surface configured to receive and support a tablet and a peripheral edge 20A extending around the body. In FIG. 1, latching mechanism 12 is positioned along a first directional line relative to support body 20, and arms 18A and B are positioned along a second directional line (generally corresponding to a longitudinal axis of the arms) relative to support body 20, substantially perpendicular to the first directional line. Arms 18A and B can include ledges 23, 24, respectively, that are configured to help support a tablet retained on the support body. As shown, the arms can act as a clamping mechanism to retain a tablet, and the ledges can include a generally C-shaped configuration open at the top such that the tablet can be slid vertically away from the arms. Latching member 12 and arms 18A and B can be configured to be movable relative to support body 20 so as to releasably retain the tablet.

Pivotal top member 14 can be attached to the body 20 via a hinge 16. When the pivotal top member 14 pivots about hinge 16 towards support body 20, pivotal top member 14 pivots against a tablet positioned on support body 20 thereby retaining the tablet. When pivotal top member 14 pivots about 16 away from support body 20, pivotal top member 15 pivots away from the tablet positioned in support body 20 thereby releasing the tablet.

FIG. 1 also shows an interface 17 on support body 20 that can be used to attach support body 20 to an apparatus that is adapted to position it relative to a support surface. Some examples of different apparatuses are shown in FIG. 15, 16, 17, 18. In the example in FIG. 1, the interface 17 can include apertures 17a, 17b, 17c, and 17d and can be a VESA (Video Electronics Standards Association) compliant interface that allows body 20 to be attached to a wide variety of arms, stands, wall mounts, and displays.

FIG. 2A shows a perspective view of an embodiment of a tablet mounting system 100, which may be optionally coupled to other support apparatuses as will be discussed. The tablet mounting system 100 generally includes a tablet support body 101 having a peripheral edge 101A and configured to support a tablet and at least two (e.g., four) edge retaining members (sometimes referred to herein as arms or engagement arms) 102, 103, 104, 105 that are configured to releasably engage a tablet and hold it in place. The first surface 108 is configured to support a tablet, either directly or via one or more spacers as described below.

As shown, engagement arms 102 and 103 can be positioned along a first directional line (generally corresponding to the longitudinal axes of the arms) relative to support body 101 such that they will engage opposing edges of the tablet. Likewise, engagement arms 104 and 105 are positioned along a second directional line (generally corresponding to the longitudinal axes of the arms) relative to support body 101, substantially perpendicular to the first directional line, such that they will engage opposing edges of the tablet. Engagement arms 102, 103, 104, 105 are configured to be movable relative to support body 101 so as to releasably retain a tablet. When a tablet is placed on the tablet support body 101, engagement arms 102, 103, 104, 105 can be moved inward relative to support body 101 to retain the tablet by acting as a clamping mechanism to effectively clamp the tablet. The tablet can be released when one or more of engagement arms 102, 103, 104, 105 are moved outward relative to support body 101. In the embodiment shown, the arms include a first portion in a plane generally planar with the major plane of the support body, and a second portion extending generally perpendicular to the first portion, and a third portion extending generally perpendicular to the second portion. Such an embodiment forms a C-shaped gap to retain a tablet. In an alternative embodiment, second and third portions can be replaced by a pivoting member as described with respect to FIG. 1.

FIG. 2A also shows spacers 106a, 106b coupled (e.g. fastened, glued, integral, etc.) to the first surface 108 of support body 101. Each spacer is configured to help support a tablet when the tablet is retained in tablet mount system 100 and position it a distance away from the surface 108, and allows the system to accommodate tablets having different depths or tablets retained in a cover or sleeve as described further below. Also as shown, any or all of the engagement arms can include apertures that are aligned with any interface or power connections the tablet may have such that when a tablet is engaged by the engagement arms, the tablet's interface and power connections are still accessible to the user. In the example in FIG. 1, engagement arms 103, 104, 105 include apertures 107a, 107b, 107c, respectively, which allow access to a tablet's connectors when the tablet is engaged by the engagement arms and retained within the system.

FIG. 2B shows a rear perspective view of the tablet mount 100. Here, a back cover provides a second surface 204 that includes an interface 201 configured to attach the tablet support body 101 to an apparatus adapted to position the tablet mount 100 relative to a support surface. Some examples of different apparatuses are shown in FIG. 15, 16, 17, 18. In the example in FIG. 2B, the interface 201 can include apertures 201a, 201b, 201c, 201d and is a VESA compliant interface that allows tablet mount 100 to be attached to a wide variety of arms, stands, wall mounts, and displays. As shown in FIG. 2A, the apertures can also extend through first surface 108 such that they extend through the entire body 101 of the system 100.

FIG. 3 shows a perspective view of one example of tablet mount 100 retaining a tablet 301. For purposes of this application, the tablet 301 is illustrated as semi-transparent or translucent to allow the viewing of the tablet mount. Tablet 301 is retained by the tablet mount 100 by engagement arms 102, 103, 104, 105. Engagement arms 102, 103 engage opposing edges 302, 303, of tablet 301, respectively, and engagement arms 104, 105 engage opposing edges 304, 305, respectively. While retained, tablet 301 rests adjacent to first surface 108 and is supported by support body 101. FIG. 3 also shows spacers 106a, 106b supporting tablet 301a distance away from surface 108. Tablet 301 can be released from the tablet mount 100 by moving engagement arms 102, 103, 104, 105 outward relative to support body 101, and, in some embodiments, can act as a ledge configured to receive an edge of a tablet. As shown, engagement arm 103 includes an aperture 107a that aligns with interface connection 306 of tablet 301 such that interface connection 306 is accessible while tablet 301 is retained in tablet mount system 100.

FIG. 3 shows a tablet oriented in "portrait" orientation, where the longer edge of the tablet is oriented vertically and the shorter edge of the tablet is oriented horizontally. Generally, tablets are also designed to be used in "landscape" orientation, where the longer edge of the tablet is oriented horizontally and the shorter edge of the tablet is oriented vertically. Referring to FIG. 3, tablet 301 can also be retained by tablet mount 100 in a landscape orientation where tablet 301 is rotated 90 degrees clockwise, or counterclockwise, relative to support body 101. In this orientation, engagement arms 102, 103 will engage opposing edges 304, 305, and engagement arms 104, 105 will engage opposing edges 302, 303. Interface connection 306 is still accessible via apertures 107b, 107c on engagement arms 104, 105, respectively, depending on the orientation of tablet 301. Alternatively, in some embodiments, portrait/landscape adjustment can be achieved by disengaging the interface from a support apparatus, turning the system ninety degrees, and reengaging the interface and the support apparatus.

FIG. 4 shows a side view of one example of a tablet mount 100 retaining tablet 301. Here, tablet 301 is retained by engagement arms 102, 103, 105, and also engagement arm 104 (not shown), respectively engaging edge 302, 303, 305, and edge 304 (not shown). The tablet is retained adjacent to support body 101 and is further supported by spacers 106a and 106b, such that a rear surface of a tablet is spaced from surface 108.

Tablets are often protected by cases or sleeves. Some embodiments of the invention allow the spacers 106a and 106b to be removed to accommodate the additional thickness of the case. FIG. 5 shows a perspective view of one example of a tablet mount 110 without spacers that is configurable to accommodate tablets with a protective case or sleeve. In some embodiments, the rear of the case is in apposition to surface 108. FIG. 6 shows a side view of the tablet mount 110 retaining tablet 301 which is encased in protective sleeve 601. In this example, the lack of spacers on tablet support body 101 allows tablet mount 110 to accommodate the extra depth added to tablet 301 by protective sleeve 601.

Referring back to FIG. 5, some embodiments of the tablet system 100 include a spacer interface 500 located on the first surface 108 of support body 101 to releasably attach the spacers 106a and 106b to the surface 108. In this example, spacer interface 500 can include one or more coupling points 501, 502, 503, 504, 505, 506, and are configured to couple spacers 106a, 106b (not shown in FIG. 5) to support body 101. Spacers 106a, 106b may be removed from support body 101 to accommodate a tablet in a protective case or sleeve, or coupled to support body 101 to accommodate tablets without a protective case or sleeve.

FIG. 7 shows a front view of an embodiment of a tablet mount system 100 where the first surface has been removed revealing the inside of support body 101, and FIG. 8 shows a perspective view where first surface 108 is translucent revealing the inside of support body 101. As shown, engagement arms 102, 103 can be moved inward and outward relative to support body 101 by sliding along guide rails 801a-b, and 802a-b, respectively. Not shown are corresponding grooves on engagement arms 102, 103 that slidingly engage with guide rails 801a-b, 802a-b.

In this example, engagement arm 102 is configured with a latch system 900, spring system 800, and dampening system 950. Embodiments of each of these systems will be described further below. These systems can work in concert to releasably retain a tablet. Latch system 900 can be configured to engage and disengage engagement arm 102, respectively fixing and releasing it relative to support body 101. Spring system 800 is configured to automatically eject engagement arm 102 outward relative to support body 101 when latch system 900 is disengaged to release a retained tablet. Consequently, any tablet retained by tablet mount 100 can be quickly released. Dampening system 950 can be configured to control the rate at which engagement arm 102 is ejected.

FIG. 9 shows a perspective view of one example of an embodiment of a latch system 900 and a dampening system 950. In this example, latch system 900 is engaged and the position of engagement arm 102, relative to support body 101, is fixed. When latch system 900 is disengaged, engagement arm 102 is no longer fixed and is able to move freely relative to support body 101.

Latch system 900 engages with engagement arm 102 via locking bracket 901. FIG. 11 is a closer view of locking bracket 901 and shows releasable coupler's teeth 905. Releasable coupler's teeth 905 is configured to align with arm teeth 902a, 902b on engagement arm 102. When locking bracket 901 is engaged with arm teeth 902a, 902b, latch system is engaged and the position of engagement arm 102 is fixed because of the interface between the teeth. When locking bracket 901 is disengaged from arm teeth 902a, 902b, latch system 900 is disengaged and engagement arm 102 is able to move freely relative to support body 101. Channel 903 in engagement arm 102 is aligned in such a way that locking bracket 901 will not impede the movement of engagement arm 102 as it slides along guide rails 801a, 801b (shown in FIG. 8) unless the teeth are engaged.

FIG. 10 shows a cross-section side view of one example of a tablet system 100 and shows an embodiment of a release mechanism 202 configured to actuate (e.g., engage and disengage) latch system 900. In this example, latch system 900 is engaged and the position of engagement arm 102 is fixed relative to support body 101. Release mechanism 202 can be coupled with locking bracket 901 by screw 904. Support body 101 includes cavity 1002 which can be configured to receive release mechanism 202 and is sufficiently deep to allow release mechanism surface 1004 to sit flush with second surface 204 while still leaving depression space 1003. This configuration allows release mechanism 202 to be depressed relative to second surface 204. When release mechanism 202 is depressed, spring 1001 is compressed. When release mechanism 202 is released, spring 1001 decompresses and returns release mechanism 202 and locking bracket 901 to their original positions.

Latch system 900 can be disengaged when release mechanism 202 is depressed. Depressing release mechanism causes locking bracket 101 to disengage from engagement arm 102 as release coupler's teeth 905 (shown in FIG. 11) are disengaged from teeth 902a/b. Releasing release mechanism causes locking bracket 901 to engage with engagement arm 102, thereby fixing its position relative to support body 101.

Generally, when release mechanism 202 is not depressed, engagement arm 102 is fixed relative to support body 101. However, in some embodiments, the angle of engagement between releasable coupler's teeth 905 and teeth 902 is configured such that engagement arm 102 can be moved inward relative to support body 101 even when release mechanism 202 is not depressed, and the release mechanism only needs to be depressed to move the arm outwardly to disengage the tablet.

As noted above, when latch system 900 is disengaged, spring system 800 can be configured to automatically eject engagement arm 102 relative to support body 101 to release a retained tablet. Referring to FIG. 8, spring system can include springs 803a, 803b and can be configured to compress when engagement arm 102 is moved inward relative to support body 101, and expand when engagement arm 102 is moved outward relative to support body 101. When release mechanism is depressed causing latch system 900 to disengage, engagement arm 102 is able to move freely relative to support body 101; therefore, when latch system 900 is disengaged, springs 803a, 803b expand and cause engagement arm 102 to move outward relative to support body 101.

FIG. 9 also shows an embodiment of a dampening system 950 which can be configured to control the rate at which engagement arm 102 is ejected by spring system 800. In this example, dampening system 950 includes dampening mechanism 951, dampening gear 952 and a plurality of gear indentations 953. In FIG. 9, gear indentation 953 are engaged with dampening gear 952 and are located along an edge of engagement arm 102. Dampening gear 952 provides centripetal resistance and is coupled to dampening mechanism 951, which may include a frictional coupling with gear 952, a spring, or any other mechanism to dampen the rotational motion of gear 952. When engagement arm 102 is ejected by spring system 800, it causes gear indentation 953 to rotate dampening gear 952 thereby also rotating dampening mechanism 951. The centripetal resistance provided by dampening mechanism 951 suppresses the rotation of dampening gear 952 and controls (e.g., reduces) the velocity at which engagement arm 102 is ejected.

In some embodiments, arms 104 and 105 can be slidably received within the body of the system 100 such that they can be adjusted to accommodate tablets of different sizes or tablets placed in different orientations. In certain embodiments, the system is configured such that the arms slide synchronously. FIG. 12 shows a perspective view of one example of a tablet mount 100 where first surface 108 (not shown) has been removed revealing the inside of support body 101. This exemplary example includes geared system 1200 which synchronizes the movement of engagement arms 104, 105 thereby allowing a user to adjust two engagement arms simultaneously. Engagement arms 104, 105 each have teeth 1202a, 1202b, respectively. Teeth 1202a, 1202b are both configured to engage with communal gear 1201 which can freely rotate and is fixed to support body 101. This configuration allows engagement arm 104, 105 to move synchronously to facilitate centering the tablet on the body 101. For example, in FIG. 12, when engagement arm 104 is manually moved inward toward support body 101, teeth 1202a cause communal gear 1201 to rotate clockwise. As communal gear 1201 rotates clockwise, it pulls on teeth 1202b and causes engagement arm 105 to move inward toward support body 101 at the same rate at which engagement arm 104 is manually moved (or vice versa).

FIG. 13 shows a perspective view of an embodiment of a tablet mount system 100 where the first surface 108 (not shown) has been removed revealing adjustment mechanism 1300 to accommodate tablets of different size and tablets placed in different orientations. FIG. 14 shows a cross-sectional side view of one example of a tablet mount system 100. In FIG. 13, engagement arm 103 includes groove 1303 and is configured to interface and slidingly engage with adjustment mechanism 1301 such that when it is secured to support body 101, it fixes the position of engagement arm 103 relative to support body 101. FIG. 14 shows how adjustment mechanism 1301 is secured by a screw 203. When screw 203 is loosened, adjustment mechanism releases engagement arm 103 allowing it to move freely relative to support body 101. Channel 1302 in engagement arm 103 is aligned in such a way that adjustment mechanism 1301 will not impede the movement of engagement arm 103 as it slides along guide rails 802a, 802b (shown in FIG. 8), and adjustment mechanism 1301 can also include an expanded head portion that prohibits arm 103 from completely disengaging from body 101 even when screw 203 is loose.

Figure 16:
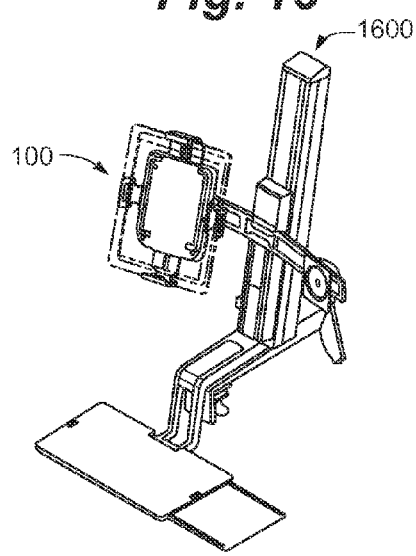
FIG. 16 is a perspective view of a tablet mounting system in accordance with an embodiment.
Figure 17:
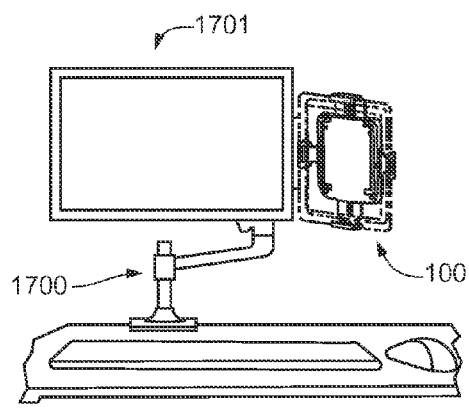
FIG. 17 is a front view of a tablet mounting system in accordance with an embodiment.
Figure 18:
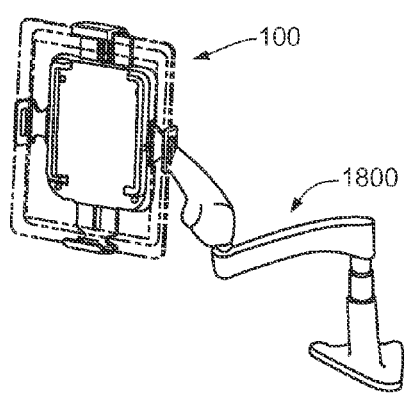
FIG. 18 is a perspective view of a tablet mounting system in accordance with an embodiment.

FIGS. 15, 16, 17 and 18 show different representative support apparatuses that can be used to support any of the tablet mounting systems described herein. FIG. 15 depicts a tablet mounting system 100 on a wall mounted reclining workstation. FIG. 16 depicts a tablet mounting system 100 on a sit-stand workstation. FIG. 17 depicts a tablet mounting system 100 on an arm in a multiple display system. FIG. 18 depicts a tablet mounting system 100 on an arm. It should be noted that system 10 shown in FIG. 1 can likewise be similarly attached to and supported by a support apparatus.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A tablet mounting system comprising:
a tablet support body having a first surface configured to receive and support a tablet;
an interface for attaching the tablet support body to an apparatus that is adapted to position the tablet support body relative to a support surface; and
at least a first edge retaining member, a second edge retaining member, a third edge retaining member, and a fourth edge retaining member,
the first edge retaining member extending from the tablet support body and being configured to retain a first edge of the supported tablet,
the second edge retaining member extending from the tablet support body and being configured to retain a second edge of the supported tablet opposite the first edge,
the third edge retaining member extending from the tablet support body and being configured to retain a third edge of the supported tablet adjacent the first edge, and
the fourth edge retaining member extending from the tablet support body and being configured to retain a fourth edge of the supported tablet opposite the third edge,
each of the first edge retaining member, the second edge retaining member, the third edge retaining member, and the fourth edge retaining member being movable relative to the tablet support body so as to releasably retain the supported tablet adjacent the tablet support body,
wherein movement of one of the first and the second edge retaining members causes synchronous movement of the other of the first and the second edge retaining members relative to the tablet support body to releasably retain the supported tablet.

2. The tablet mounting system of claim 1, wherein the first edge retaining member comprises a first arm extending away from the tablet support body and wherein the second edge retaining member comprises a second arm extending away from the tablet support body in an opposite direction from the first arm, wherein the first arm and the second arm engage opposing edges of the supported tablet and wherein at least one of the first arm and the second arm is adjustable relative to the tablet support body so as to releasably retain the supported tablet.

3. A tablet mounting system comprising:
a tablet support body having an interface for coupling to a support apparatus, the tablet support body comprising a peripheral edge and a first surface configured to receive and support a tablet; and
a clamping mechanism configured to releasably retain the supported tablet adjacent the tablet support body, the clamping mechanism comprising:
a first engagement arm, a second engagement arm, a third engagement arm, and a fourth engagement arm, each of the first, second, third, and fourth engagement arms extending from the tablet support body proximate the peripheral edge, each of the first, second, third, and fourth engagement arms configured to engage edges of the supported tablet, and each of the first second, third, and fourth engagement arms being movable relative to the tablet support body so as to releasably retain the supported tablet adjacent the tablet support body,
wherein movement of one of the first and the second engagement arms causes synchronous movement of the other of the first and the second engagement arms relative to the tablet support body to releasably retain the supported tablet.

4. The tablet mounting system of claim 3, further comprising a gear mechanism coupling the first and the second engagement arms, wherein the movement of one of the first and the second engagement arms causes the movement of the other of the first and the second engagement arms relative to the tablet support body to releasably retain the supported tablet.

5. The tablet mounting system of claim 3, further comprising a locking mechanism configured to lock movement of the first engagement arm when the locking mechanism is engaged and to permit movement of the first engagement arm when the locking mechanism is disengaged.

6. The tablet mounting system of claim 5, wherein the first engagement arm comprises a row of teeth and the locking mechanism comprises a locking bracket comprising teeth configured to engage the row of teeth on the first engagement arm.

7. The tablet mounting system of claim 6, wherein the locking bracket is spring loaded so as to be normally engaged with the first engagement arm.

8. The tablet mounting system of claim 5, further comprising a bias spring coupled to the first engagement arm that urges the first engagement arm out away from an edge of the supported tablet when the locking mechanism is disengaged.

9. The tablet mounting system of claim 8, further comprising a dampening gear coupled to the first engagement arm and configured to provide resistance to the movement of the first engagement arm relative to the tablet support body.

10. The tablet mounting system of claim 3, further comprising one or more spacers attached to the first surface of the tablet support body.

11. The tablet mounting system of claim 3, wherein at least one of the first and the second engagement arms comprises an aperture for receiving a tablet connector there through for connecting the tablet connector to a port in the supported tablet.

12. A tablet mounting system comprising:
a tablet support body having a first surface configured to receive and support a tablet;
an interface for attaching the tablet support body to an apparatus that is adapted to position the tablet support body; and
a clamping mechanism configured to releasably retain the supported tablet adjacent the tablet support body, the clamping mechanism comprising:
first and second edge retaining members extending from the tablet support body generally along a first directional line in relation to the tablet support body, the first and the second edge retaining members being configured to retain, respectively, opposing first and second edges of the supported tablet, and
third and fourth edge retaining members extending from the tablet support body generally along a second directional line substantially perpendicular to the first directional line, the third and the fourth edge retaining members being configured to retain, respectively, opposing third and fourth edges of the supported tablet,
each of the first, second, third, and fourth edge retaining members being movable relative to the tablet support body so as to releasably retain the supported tablet adjacent the tablet support body, wherein movement of one of the first and the second edge retaining members causes synchronous movement of the other of the first and the second edge retaining members relative to the tablet support body to releasably retain the supported tablet.

13. The tablet mounting system of claim 12, wherein the first and second edge retaining members comprise first and the second engagement arms, respectively.

14. The tablet mounting system of claim 12, wherein the first edge retaining member comprises a spring-biased first engagement arm movable relative to the tablet support body, and further comprising a locking mechanism configured to lock movement of the first engagement arm when the locking mechanism is engaged and to permit movement of the first engagement arm when the locking mechanism is disengaged.

* * * * *